United States Patent [19]

Woo

[11] Patent Number: 5,703,752
[45] Date of Patent: Dec. 30, 1997

[54] HEAT DISSIPATING APPARATUS FOR A SEMICONDUCTOR DEVICE FOR USE IN A MOTOR DRIVE

[75] Inventor: Suk Ha Woo, Kyunggi-Do, Rep. of Korea

[73] Assignee: Samsung Electro-Mechanics Co., Ltd., Kyunggi-do, Rep. of Korea

[21] Appl. No.: 518,505

[22] Filed: Aug. 23, 1995

[30] Foreign Application Priority Data

Aug. 23, 1994 [KR] Rep. of Korea ............... U94-21228

[51] Int. Cl.$^6$ ............................................... H05K 7/20
[52] U.S. Cl. ........................... 361/704; 361/719; 361/720
[58] Field of Search .......................... 165/80.2, 80.3, 165/185; 174/16.3; 257/707, 712, 713; 361/704, 706, 707, 715, 717–723, 807, 809

[56] References Cited

U.S. PATENT DOCUMENTS

| | | | |
|---|---|---|---|
| 4,254,447 | 3/1981 | Griffis | 361/719 |
| 4,682,269 | 7/1987 | Pitasi | 361/704 |
| 4,764,804 | 8/1988 | Sahara et al. | 257/713 |
| 4,945,451 | 7/1990 | Gohl et al. | 174/16.3 |
| 4,965,699 | 10/1990 | Jorden et al. | 361/706 |
| 4,974,119 | 11/1990 | Martin | 361/720 |

*Primary Examiner*—Gregory D. Thompson
*Attorney, Agent, or Firm*—Lowe, Price, LeBlanc & Becker

[57] ABSTRACT

A heat dissipating apparatus for a semiconductor device for use in a motor drive that improves heat dissipation efficiency by transferring heat from the semiconductor device directly to a heat sink, using ground leads or nonconnection leads of element lead pins. In addition, it is possible to connect the semiconductor device to the heat sink without extra fixing members

16 Claims, 3 Drawing Sheets

HEAT DISSIPATING APPARATUS FOR A SEMICONDUCTOR DEVICE FOR USE IN A MOTOR DRIVE

BACKGROUND OF THE INVENTION

1. Field of the Invention

The present invention relates to a heat dissipating apparatus for a semiconductor device for use in a motor drive. More particularly, this invention relates to a heat dissipating apparatus for a semiconductor device that improves heat dissipation efficiency by contacting lead pins formed on a semiconductor package directly to a heat sink, thereby connecting the semiconductor device to the heat sink without extra fixing members.

2. Description of the Prior Art

Generally, in a motor driven by a semiconductor device mounted on a printed circuit board of a phenol or an epoxy substance, if the motor is overloaded due to long use, this results in heat over the semiconductor device. The motor performance decreases as the heat increases, and the semiconductor device may be damaged due to thermal influx. Thus, it is required to attach a heat sink, such as an iron plate or an aluminum plate, to the printed circuit board to dissipate the heat. FIGS. 1A and 1B show two types of conventional heat dissipating apparatus of a semiconductor device. A heat dissipating apparatus illustrated in FIG. 1A will be considered first.

Copper patterns are formed on the upper surface of a printed circuit board 10, and a heat sink 12 is attached to the bottom surface of the printed circuit board 10 by means of a nonconductive adhesive. A lead 15 formed on a package 14 of a semiconductor device 13 is soldered on the corresponding copper lands 11. The device 13 constitutes a drive circuit together with other parts.

Two holes 16 are formed at the lateral ends of the package 14. These holes are for convenient conjunction with a heat sink. Heat from the semiconductor device 13 can be transferred to the heat sink 12 by connecting the package 14 to the heat sink 12 with set screws 17 through the holes 16.

Since heat on a semiconductor device is transferred to a heat sink through set screws, extra set screws or other fixing members are indispensable in a conventional heat dissipating apparatus, thereby resulting in additional manufacturing steps as well as incurring additional material and total manufacturing costs. In addition, of the heat generated from the semiconductor device, the heat generated near the set screws only can be transferred to a heat sink due to the limited size of the set screws. Thus, efficient heat dissipation cannot be carried out.

In another type of conventional heat dissipating apparatus of a semiconductor device as illustrated in FIG. 1B, heat over the semiconductor device 13 is transferred to the heat sink 12 through a separate bracket 18, one part of which is attached to the package 14 and the other part of which is attached to the heat sink 12. This technique generally used for semiconductor devices having no fixing holes thereon is also applicable to the semiconductor devices having fixing holes, as illustrated in FIG. 1A.

However, since such a heat dissipating apparatus for a semiconductor device includes an extra heat dissipating bracket, the space occupied by overall parts becomes larger. Thus, employing a conventional heat dissipating apparatus for a semiconductor device decreases space-using efficiency and incurring additional material costs, thereby increasing total manufacturing costs.

SUMMARY OF THE INVENTION

It is an object of the present invention to provide a heat dissipating apparatus for a semiconductor device for use in a motor drive, which will effectively transfer heat dissipated by a semiconductor device to a heat sink through leads. It is another object of the present invention to improve motor performance by providing a structure in which the semiconductor device and the heat sink can be easily connected, thereby decreasing material costs and total manufacturing costs.

According to one aspect of the present invention, there is provided a heat dissipating apparatus for a semiconductor device for use in a motor drive comprising:

- a printed circuit board on which a semiconductor device having a plurality of leads on its package is mounted;
- heat dissipating means attached to the bottom surface of the printed circuit board to dissipate heat generated from the semiconductor device;
- printed circuit board holes formed in a predetermined diameter on the printed circuit board through which leads for heat dissipation, of the plurality of leads of the semiconductor device, are inserted thereinto after penetrating the printed circuit board and transferring heat generated from the semiconductor device to the heat dissipating means in conjunction with the heat dissipating means; and
- heat dissipating holes formed in a predetermined diameter on the spot corresponding to the printed circuit board holes of the heat dissipating means so that the heat dissipating leads penetrating the printed circuit board can be inserted into the printed circuit board holes.

According to another aspect of the present invention, there is provided a heat dissipating apparatus for a semiconductor device for use in a motor drive comprising:

- a printed circuit board on which a semiconductor device having a plurality of leads on its package is mounted;
- heat dissipating means attached to the bottom surface of the printed circuit board to dissipate heat generated from the semiconductor device;
- printed circuit board holes formed in a predetermined diameter on the printed circuit board through which leads for heat dissipating, of the plurality of leads of the semiconductor device, are inserted thereinto after penetrating the printed circuit board and transferring heat generated from the semiconductor device to the heat dissipating means in conjunction with the heat dissipating means; and
- ribs formed in a predetermined diameter on the spot corresponding to the printed circuit board holes of the heat dissipating means so that the heat dissipating leads penetrating the printed circuit board can be inserted into the printed circuit board holes.

BRIEF DESCRIPTION OF THE DRAWINGS

The other objects and merits of the present invention will become more apparent from the following detailed description taken in conjunction with the accompanying drawings in which.

DETAILED DESCRIPTION OF THE PREFERRED EMBODIMENTS

The following is a detailed description of the preferred embodiments of a heat dissipating apparatus for a semiconductor device for use in a motor drive according to the present invention with reference to the attached drawings.

Figure 1A:
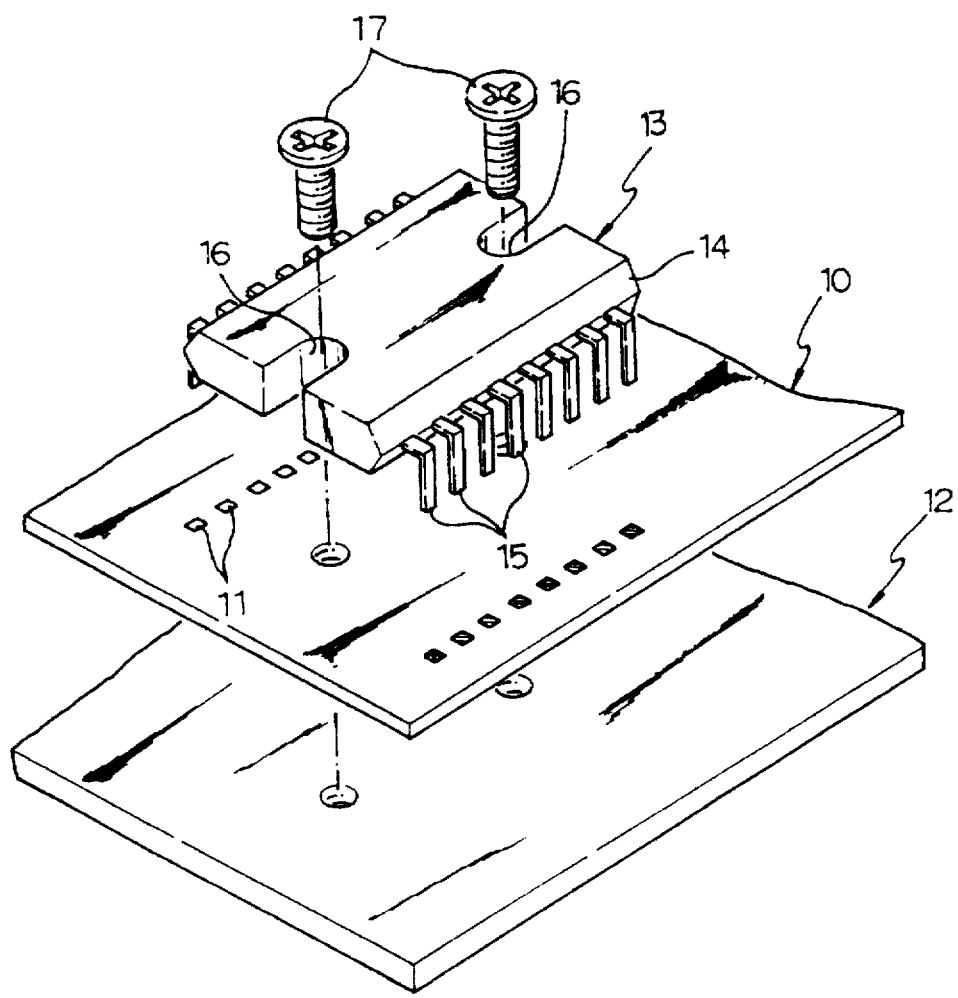
FIG. 1A is an exploded perspective view showing a conventional heat dissipating apparatus for a semiconductor device for use in a motor drive.
Figure 1B:
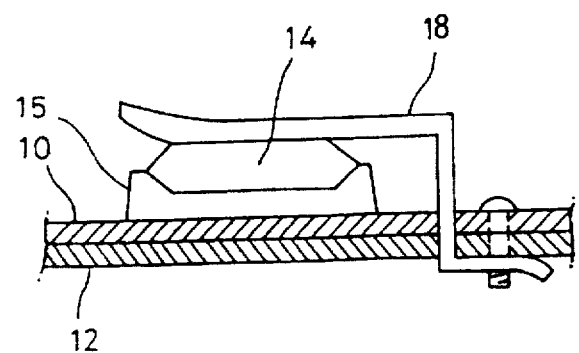
FIG. 1B is a cross-sectional view showing another conventional heat dissipating apparatus.
Figure 2A:
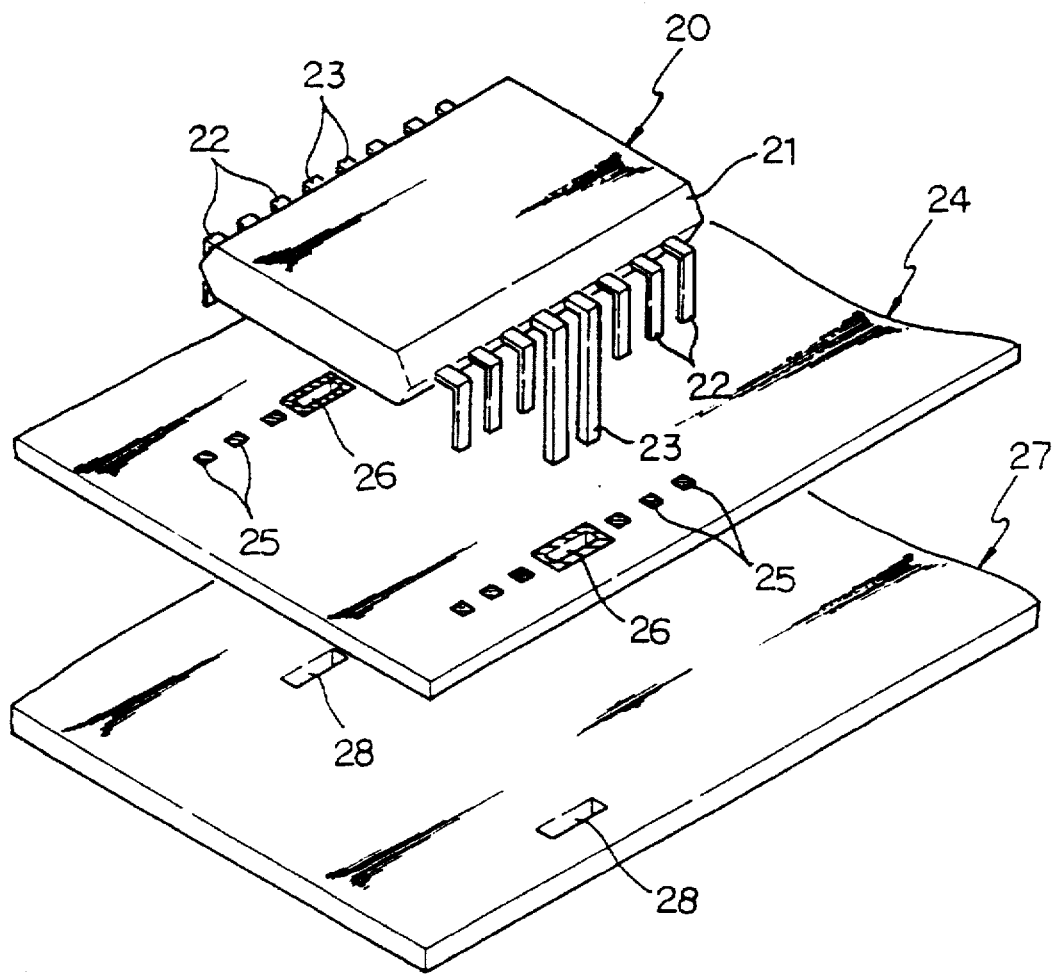
FIGS. 2A and 2B, which are respectively an exploded perspective view and a cross-sectional view, show one embodiment of a heat dissipating apparatus for a semiconductor device for use in a motor drive according to the present invention.
Figure 2B:
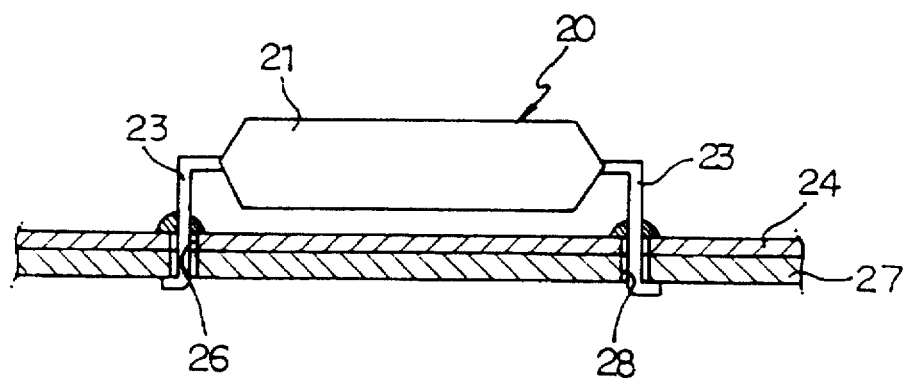

FIGS. 2A and 2B are respectively an exploded perspective view and a cross-sectional view, both of which illustrate one embodiment of the present invention. As shown, there is found a plurality of leads 22 on a package 21 of a semiconductor device 20. These leads 22 usually include ground leads and non-connection (NC) leads isolated from other leads. In this embodiment, the ground or the NC leads will serve for heat dissipation. (hereinafter referred to as "the heat dissipation leads 23")

In FIG. 2A, the heat dissipation leads 23 are shown as being longer than leads 22. Such a predetermined length difference is to achieve an object of the present invention, i.e., to advance the processing in a pretreatment processing step. Any manufacturing sites commonly employ a pretreatment processing step for lead cutting or circuit board masking, etc.

A plurality of land patterns 25 are formed on a printed circuit board 24 on which a semiconductor device 20 is mounted. The semiconductor device 20 can be mounted on the circuit board 24 by soldering the leads 22 on the lands 25. Of the land patterns 25, the lands corresponding to the heat dissipation leads 23 has a hole 26 in a predetermined diameter into which the heat dissipation leads 23 can penetrate.

Beneath the printed circuit board 24, a heat sink 27 serving as a heat dissipating member to dissipate heat over the semiconductor device 20 is attached. This heat sink 27 has a hole 28 into which the heat dissipation leads 23 will be inserted.

When assembling the printed circuit board 24 and the heat sink 27, the heat sink 27 is attached to the bottom surface of the circuit board 24 so that the holes 26 of the printed circuit board overlap with the holes 28 of the heat sink 27. The heat dissipation leads 23 are inserted into the holes 28 of the heat sink 27 after penetrating the holes 26 of the printed circuit board 24.

The heat dissipation leads 23 downwardly penetrating the holes 28 of the heat sink 27 are properly bent so that the heat sink 27 and the printed circuit board 24 may not be separated with each other. Heat from the semiconductor device 20 can be transferred to the heat sink 27 through these bent leads.

It is preferable to apply a heat conductive adhesive to the bent parts of the heat dissipation leads 23 for close contact and firm fixation. Soldering can be used instead according to the surface treatment of the heat sink 27. When soldering is applied and if ground leads are employed as heat dissipation leads, a secondary effect for stable circuit operation can be obtained due to an extended ground area.

It is also preferable to employ a motor yoke, which is a part of a motor casing, for the heat sink 27. This will guarantee an effective utilization of the space between and products, and owing to the extension of the ground area, motor behavior will become more stable and noise of the motor will be reduced.

In this preferred embodiment, the heat dissipation leads which transfer heat from the semiconductor device to the heat sink are directly connected to an internal chip of the semiconductor device. Therefore, it is possible to obtain more efficient heat dissipation than in an indirect dissipation through an element package, increasing reliability for a semiconductor device and improving motor capability.

In addition, since a circuit board can be connected to a heat sink without extra fixing members, manufacturing costs are reduced and performance is improved.

Figure 3A:
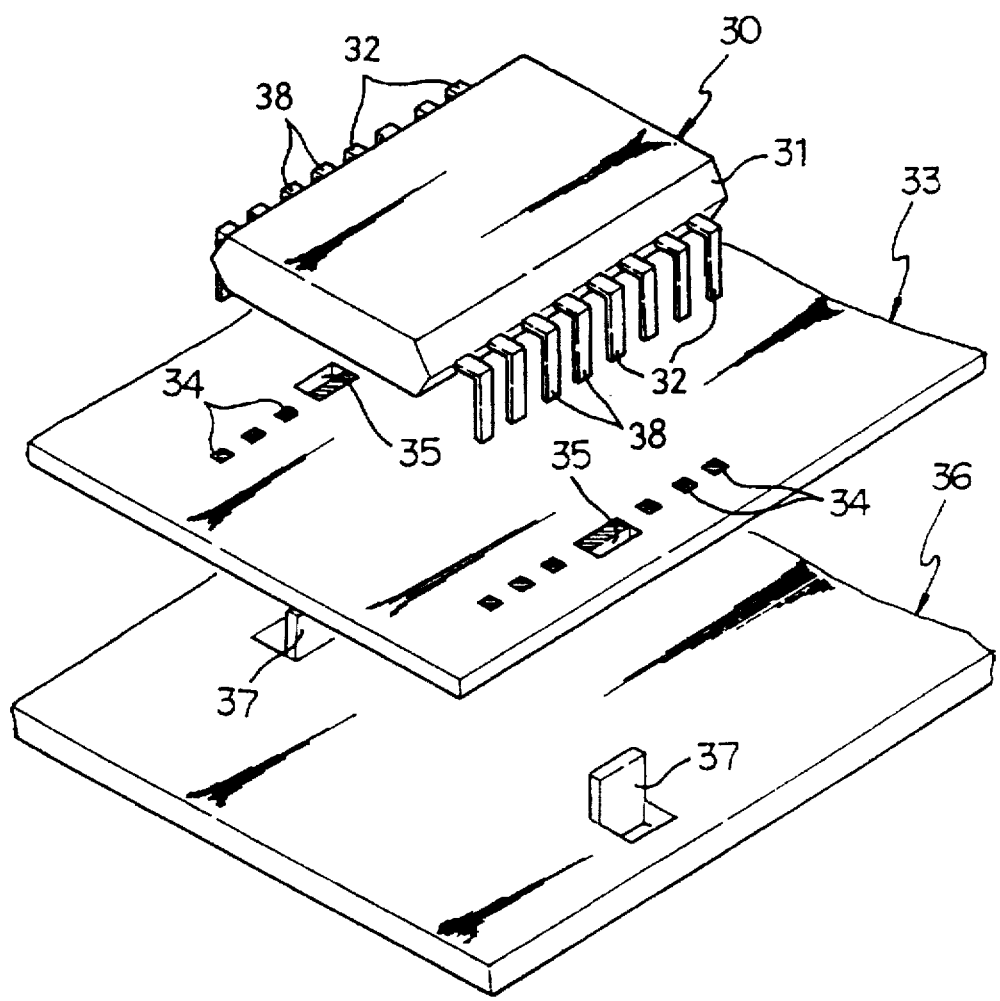
FIGS. 3A and 3B, which are respectively an exploded perspective view and a cross-sectional view, show another embodiment of a heat dissipating apparatus for a semiconductor device for use in a motor drive according to the present invention.
Figure 3B:
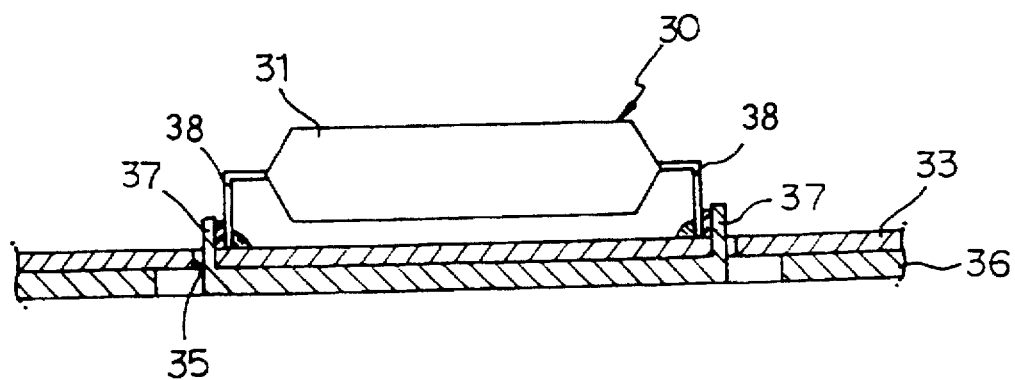

FIGS. 3A and 3B are respectively an exploded perspective view and a cross-sectional view which illustrate another embodiment of a heat dissipating apparatus for a semiconductor device for use in a motor drive according to the present invention. A plurality of leads 32 formed on a package 31 of a semiconductor device 30 is soldered on the land patterns 34 which are formed on a printed circuit board 33.

Openings 35 in a predetermined diameter, into which the heat dissipation leads 38 will be inserted, are formed on the plurality of the land patterns 34 of the printed circuit board 33. Ribs 37 are projected upward from the heat sink 36 to correspond to the openings 35. Usually, the ribs 37 are processed by cutting a portion of the heat sink 36 and bending the cut portion. FIG. 3B features a configuration after connecting the printed circuit board 33 to the heat sink 36. As described in the previous embodiment, the ribs 37 and heat dissipation leads 38 are firmly fixed by a heat conductive adhesive, and therefore, the heat dissipation efficiency can be doubled. Soldering can also be used instead according to the surface treatment of the heat sink 36. A motor yoke can also be used for the heat sink 36 in the present embodiment, as illustrated in FIGS. 2A and 2B of the previous embodiment. The invention efficiency is the same as that of the previous embodiment.

Although the present invention has been described in detail with reference to the described preferred embodiments, other embodiments can be carried out through modification of the preferred embodiments. For instance, the present invention is adaptive to a high-power semiconductor device or a non-semiconductor passive element in addition to the semiconductor device for use in a motor drive.

What is claimed is:

1. A heat dissipating apparatus for a semiconductor device for use in a motor drive, comprising:
    a printed circuit board having an upper surface on which a semiconductor device having a plurality of leads on its package is mounted wherein at least some of said plurality of leads are heat dissipation leads;
    a separate heat dissipating member attached to a bottom surface of said printed circuit board and located totally therebelow for dissipating heat from said semiconductor device;
    said printed circuit board having holes formed of a predetermined diameter in said printed circuit board for receiving said heat dissipation leads; and
    said heat dissipating member having holes formed of a predetermined diameter so that said heat dissipating leads received by said printed circuit board are in direct physical contact with walls of said holes formed in said heat dissipation member.

2. The heat dissipating apparatus according to claim 1, wherein said heat dissipation leads are ground leads.

3. The heat dissipating apparatus according to claim 1, wherein said heat dissipation leads are nonconnection leads.

4. The heat dissipating apparatus according to claim 1, wherein said heat dissipation leads are bent at a distal end thereof to structurally engage said heat dissipating member.

5. The heat dissipating apparatus according to claim 4, wherein said bent ends of said heat dissipation leads are soldered to firmly fix said bent parts to said heat dissipating member and efficiently dissipate heat from said semiconductor device.

6. The heat dissipating apparatus for a semiconductor device for use in a motor drive, comprising:

a printed circuit board having an upper surface on which a semiconductor device having a plurality of leads on its package is mounted;

a separate heat dissipating member attached to a bottom surface of said printed circuit board and located totally therebelow to dissipate heat generated from said semiconductor device wherein at least some of said plurality of leads are heat dissipation leads;

said printed circuit board having holes formed of a predetermined diameter in said printed circuit board leads for receiving said heat dissipation leads; and said heat dissipating member having upstanding ribs and adjacent corresponding holes formed so that said heat dissipating leads received by said printed circuit board are in direct physical contact with walls of said holes formed in said heat dissipation member.

7. The heat dissipating apparatus according to claim 6, wherein said heat dissipation leads are ground leads.

8. The heat dissipating apparatus according to claim 6, wherein said heat dissipation leads are nonconnection leads.

9. The heat dissipating apparatus according to claim 6, wherein said ribs are firmly fixed to said heat dissipation leads.

10. The heat dissipating apparatus according to claim 6, wherein said ribs and said heat dissipation leads are soldered to firmly fix said heat dissipation leads to said ribs.

11. The heat dissipating apparatus according to claim 4, further comprising a heat conductive adhesive applied to said heat dissipation leads to firmly fix said bent end to said heat dissipating member.

12. The heat dissipating apparatus according to claim 9, further comprising a heat conductive adhesive applied to said heat dissipating leads to firmly fix said ribs to said heat dissipating leads.

13. The heat dissipating apparatus according to claim 1, wherein said bottom surface of printed circuit board and an upper surface of said heat dissipating member are in contact with one another.

14. The heat dissipating apparatus according to claim 1, wherein corresponding holes in said printed circuit board and said heat dissipating member are in alignment.

15. The heat dissipating apparatus according to claim 6, wherein said bottom surface of printed circuit board and an upper surface said heat dissipating member are in contact with one another.

16. The heat dissipating apparatus according to claim 6, wherein corresponding holes in said printed circuit board and said heat dissipating member are in alignment.

* * * * *